United States Patent
Lin et al.

(10) Patent No.: US 9,847,368 B2
(45) Date of Patent: *Dec. 19, 2017

(54) VERTICALLY INTEGRATED IMAGE SENSOR CHIPS AND METHODS FOR FORMING THE SAME

(71) Applicant: Taiwan Semiconductor Manufacturing Company, Ltd., Hsin-Chu (TW)

(72) Inventors: Jeng-Shyan Lin, Tainan (TW); Feng-Chi Hung, Chu-Bei (TW); Dun-Nian Yaung, Taipei (TW); Jen-Cheng Liu, Hsin-Chu (TW); Szu-Ying Chen, Toufen Township (TW); Wen-De Wang, Minsyong Township (TW); Tzu-Hsuan Hsu, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/825,593

(22) Filed: Aug. 13, 2015

(65) Prior Publication Data

US 2015/0349003 A1    Dec. 3, 2015

Related U.S. Application Data

(60) Continuation of application No. 14/281,271, filed on May 19, 2014, now Pat. No. 9,123,615, which is a
(Continued)

(51) Int. Cl.
*H01L 27/146* (2006.01)

(52) U.S. Cl.
CPC .... *H01L 27/14687* (2013.01); *H01L 27/1464* (2013.01); *H01L 27/1469* (2013.01); *H01L 27/14621* (2013.01); *H01L 27/14627* (2013.01); *H01L 27/14632* (2013.01); *H01L 27/14634* (2013.01); *H01L 27/14636* (2013.01);
(Continued)

(58) Field of Classification Search
CPC . H01L 31/02; H01L 27/146; H01L 27/14687; H01L 27/14621
See application file for complete search history.

(56) References Cited

U.S. PATENT DOCUMENTS 8,514,308 B2    8/2013  Itonaga et al.
9,123,615 B2 *  9/2015  Lin .................. H01L 27/14621
(Continued)

FOREIGN PATENT DOCUMENTS

CN        102110700      6/2011
JP        201215275      1/2012
(Continued)

*Primary Examiner* — Marc Armand
(74) *Attorney, Agent, or Firm* — Slater Matsil, LLP (57) ABSTRACT

A method includes bonding a Backside Illumination (BSI) image sensor chip to a device chip, forming a first via in the BSI image sensor chip to connect to a first integrated circuit device in the BSI image sensor chip, forming a second via penetrating through the BSI image sensor chip to connect to a second integrated circuit device in the device chip, and forming a metal pad to connect the first via to the second via.

20 Claims, 13 Drawing Sheets

Related U.S. Application Data division of application No. 13/475,301, filed on May 18, 2012, now Pat. No. 8,766,387.

(52) U.S. Cl.
CPC .. *H01L 27/14645* (2013.01); *H01L 27/14685* (2013.01); *H01L 27/1462* (2013.01)

(56) References Cited

U.S. PATENT DOCUMENTS

| | | |
|---|---|---|
| 2009/0224345 A1 | 9/2009 | Lee et al. |
| 2010/0060764 A1 | 3/2010 | McCarten et al. |
| 2011/0024867 A1 | 2/2011 | Tseng et al. |
| 2011/0102657 A1* | 5/2011 | Takahashi ......... H01L 21/76898 348/308 |
| 2011/0156195 A1 | 6/2011 | Tivarus et al. |
| 2011/0233702 A1 | 9/2011 | Takahashi et al. |
| 2013/0069190 A1* | 3/2013 | Kao ................... H01L 27/1463 257/432 |

FOREIGN PATENT DOCUMENTS

| | | |
|---|---|---|
| KR | 100801447 | 2/2008 |
| KR | 1020110107747 | 10/2011 |
| TW | 201015991 | 4/2010 |
| TW | 201104851 | 2/2011 |
| TW | 201125111 | 7/2011 |
| TW | 201143063 | 12/2011 |

\* cited by examiner

VERTICALLY INTEGRATED IMAGE SENSOR CHIPS AND METHODS FOR FORMING THE SAME

PRIORITY CLAIM AND CROSS-REFERENCE

This application is a continuation of U.S. patent application Ser. No. 14/281,271, entitled "Vertically Integrated Image Sensor Chips and Methods for Forming the Same," filed on May 19, 2014, which application is a divisional of U.S. patent application Ser. No. 13/475,301, entitled "Vertically Integrated Image Sensor Chips and Methods for Forming the Same," filed on May 18, 2012, now U.S. Pat. No. 8,766,387, which applications are incorporated herein by reference.

BACKGROUND

Backside Illumination (BSI) image sensor chips are replacing front-side illumination sensor chips for their higher efficiency in capturing photons. In the formation of the BSI image sensor chips, image sensors, such as photo diodes, are formed at a front surface of a silicon substrate of a BSI wafer. The logic circuits for processing the signal of the image sensors are also formed at the front surface of the silicon substrate. An interconnect structure is then formed over, and connect to, the image sensors and the logic circuits.

After the formation of a BSI wafer, the BSI wafer is bonded to a carrier, and the silicon substrate is thinned. As a result, the silicon substrate is thin enough for light to penetrate through the silicon substrate from the backside. During and after the thinning, the carrier provides mechanical support to the thin wafer. Additional components such as metal grid, color filters, micro-lenses, and the like, are then formed on the BSI wafer. The BSI wafer and the carrier are then sawed apart into BSI chips.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A vertically stacked Backside Illumination (BSI) image sensor chip and the methods of forming the same are provided in accordance with various exemplary embodiments. The intermediate stages of forming the BSI image sensor chip are illustrated. The variations of the embodiments are discussed. Throughout the various views and illustrative embodiments, like reference numbers are used to designate like elements.

Figure 1:
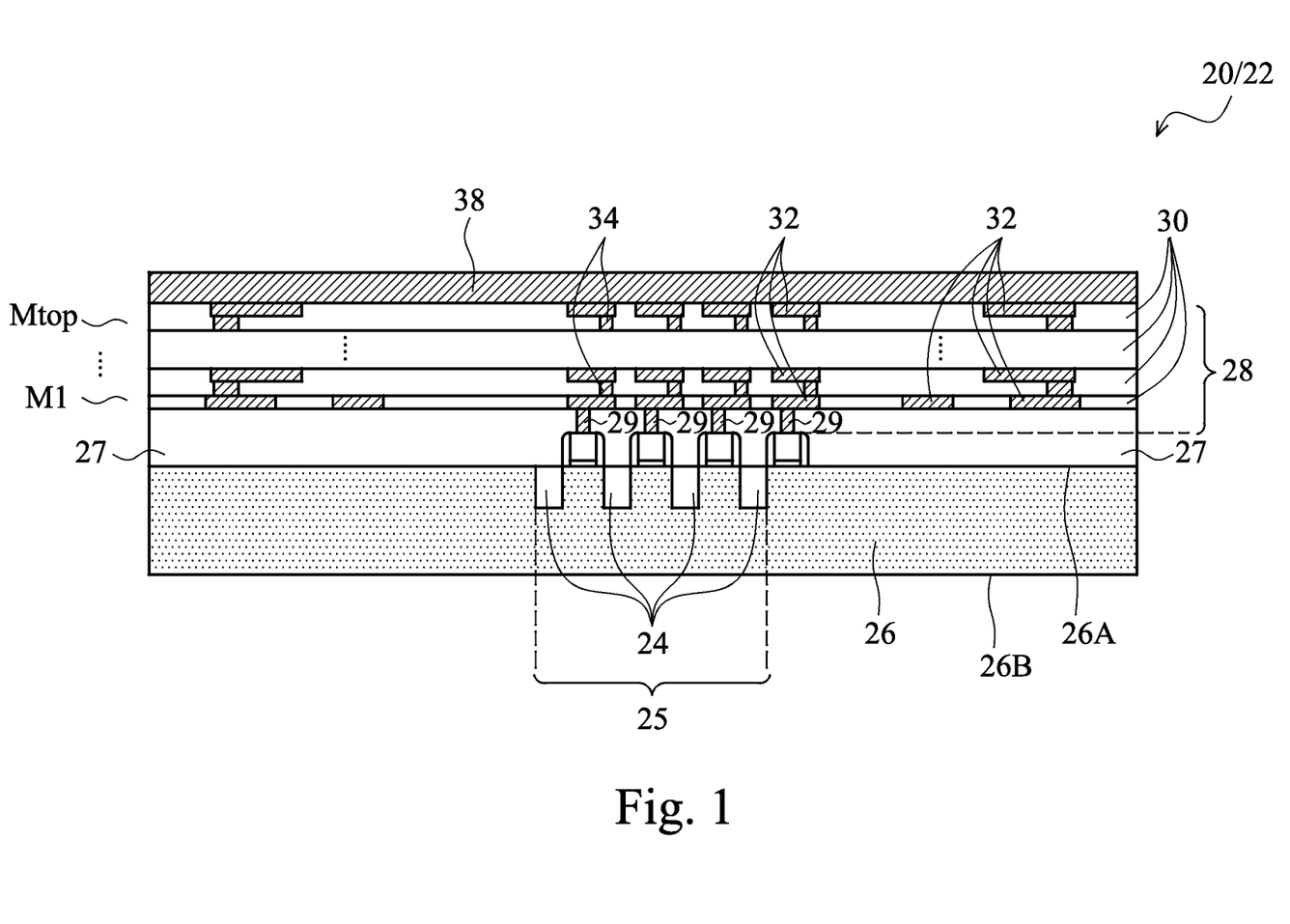
FIGS. 1 through 9 are cross-sectional views of intermediate stages in the manufacturing of a vertically stacked Backside Illumination (BSI) image sensor die in accordance with some exemplary embodiments.

FIGS. 1 through 9 illustrate the cross-sectional views of intermediate stages in the stacking of a BSI image sensor chip/wafer and a device die/wafer in accordance with some exemplary embodiments. FIG. 1 illustrates image sensor chip 20, which is a part of wafer 22. Image sensor chip 20 includes semiconductor substrate 26. Semiconductor substrate 26 may be a crystalline silicon substrate or a semiconductor substrate formed of other semiconductor materials. Throughout the description, surface 26A is referred to a front surface of semiconductor substrate 26, and surface 26B is referred to as a back surface of semiconductor substrate 26. Image sensors 24 are formed at front surface 26A of semiconductor substrate 26. Image sensors 24 are configured to convert light signals (photons) to electrical signals, and may be photo-sensitive Metal-Oxide-Semiconductor (MOS) transistors or photo-sensitive diodes. Accordingly, the respective wafer 22 is an image sensor wafer. In some exemplary embodiments, image sensors 24 extend from front surface 26A into semiconductor substrate 26, and form image sensor array 25, which is illustrated in FIG. 12.

Figure 12:
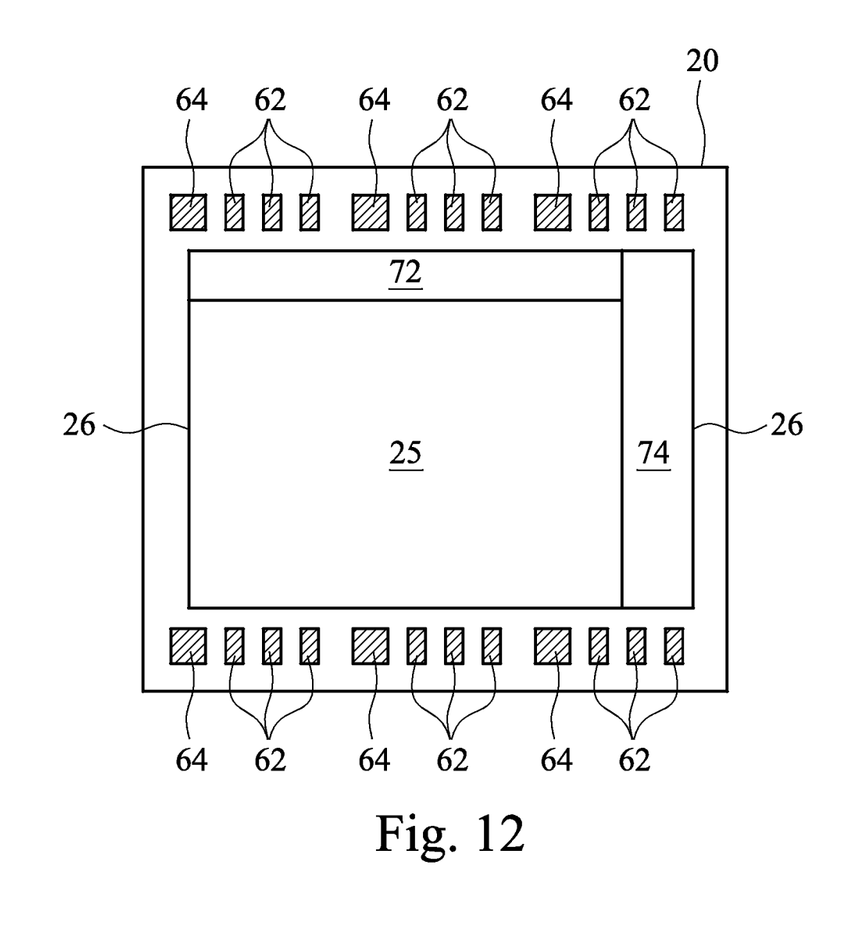
FIGS. 12 and 13 illustrate top views of the BSI chip and the device chip.

As also shown in FIG. 12, in addition to image sensor array 25, there may be additional circuits such as Analog-to-Digital Converter (ADC) 72, Correlated Double Sampling circuit (CDS, also illustrated as 72), row decoder 74, and the like, formed in image sensor chip 20. FIG. 12 illustrates an exemplary layout of image sensor array 25, ADC/CDS 72, and row decoder 74, which are used to process the electrical signals that are related to the image sensor array 25.

Referring back to FIG. 1, front-side interconnect structure 28 is formed over semiconductor substrate 26, and is used to electrically interconnect the devices in image sensor chip 20. Front-side interconnect structure 28 includes Inter-Layer Dielectric (ILD) 27 and contact plugs 29 in ILD 27. Front-side interconnect structure 28 further includes dielectric layers 30, and metal lines 32 and vias 34 in dielectric layers 30. Throughout the description, the metal lines 32 in a same dielectric layer 30 are collectively referred to as being a metal layer. Interconnect structure 28 may include a plurality of metal layers, which are referred to as bottom metal layer (M1) through top metal layer (Mtop). The bottom metal layer M1 is closest to image sensors 24. In some exemplary embodiments, dielectric layers 30 include low-k dielectric layers. The low-k dielectric layers have low k values, for example, lower than about 3.0. On top of metal layers M1 through Mtop, passivation layer 38 is formed. Passivation layer 38 is formed of non-low-k dielectric materials having k values greater than 3.9. Passivation layer 38 may be a single layer or may be a composite layer comprising a plurality of layers that are formed of different materials. In some embodiments, passivation layer 38 includes a silicon oxide layer.

Figure 2:
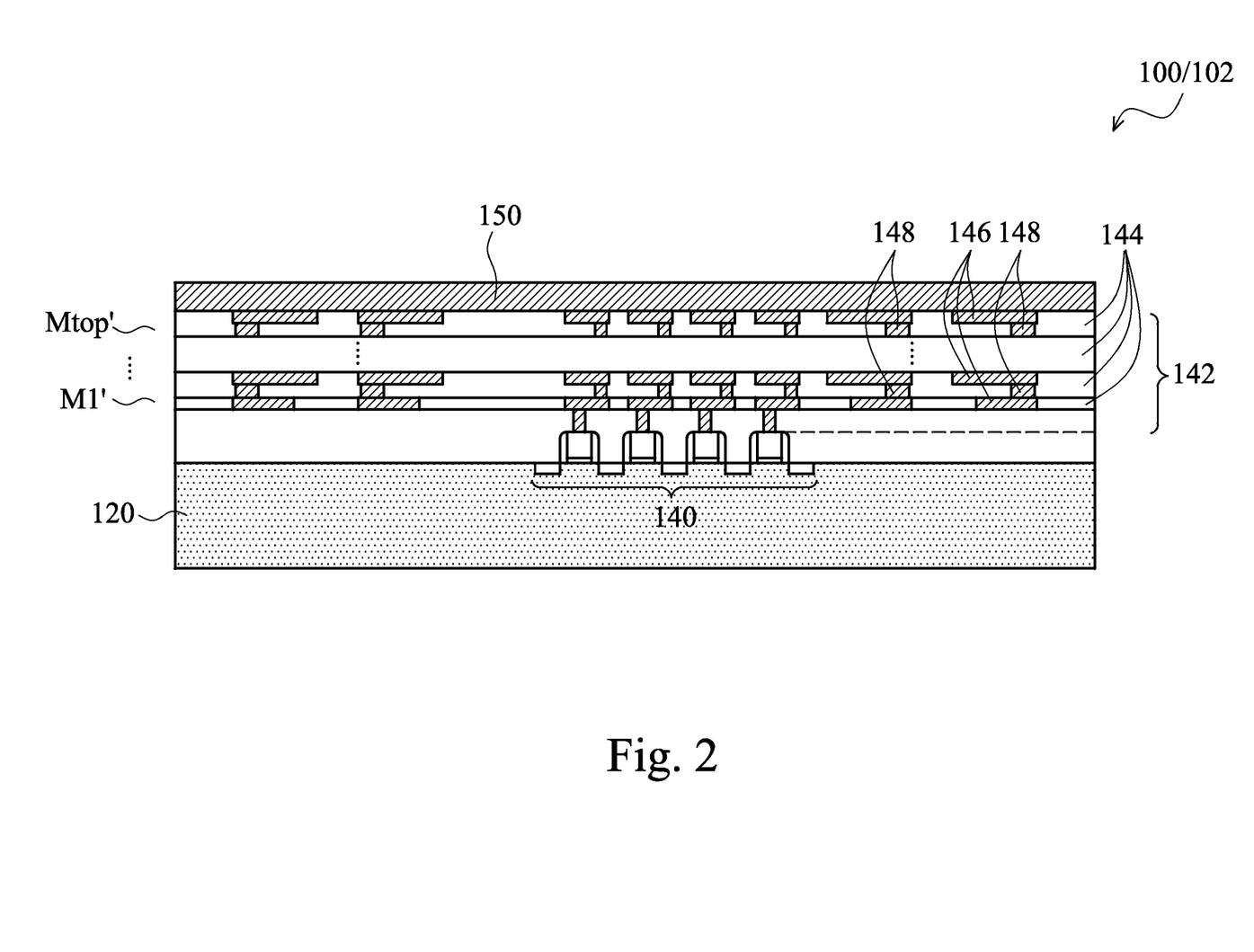

FIG. 2 illustrates a cross-sectional view of a device chip 100, which is in wafer 102 that comprises a plurality of identical device chips 100. Device chip 100 includes substrate 120, and logic circuit 140 formed at the front surface of substrate 120. Substrate 120 is a silicon substrate in some embodiments. Alternatively, substrate 120 is formed of other semiconductor materials such as silicon germanium, silicon carbon, III-V compound semiconductor materials, or the like. Logic circuit 140 may include one or more of Image Signal Processing (ISP)/Digital Signal Processing (DSP) circuits such as Auto Exposure Control (AEC) circuits, Auto Gain Control (AGC) circuits, Auto White Balance (AWB) circuits, color correction circuits, and the like. Furthermore, chip 100 may be an Application Specific Integrated Circuit (ASIC) chip.

Interconnect structure 142 is formed over, and electrically connected to, logic circuit 140. Interconnect structure 142 includes a plurality of metal layers, namely bottom metal layer M1' through top metal layer Mtop'. Interconnect structure 142 also includes dielectric layers 144. Metal lines/pad 146 and vias 148 are disposed in dielectric layers 144. In some exemplary embodiments, dielectric layers 144 include low-k dielectric layers. The low-k dielectric layers have low k values, for example, lower than about 3.0. On top of metal layers M1' through Mtop', passivation layers 150 is formed. Passivation layer 150 is formed of non-low-k dielectric materials having k values greater than 3.9. In some embodiments, passivation layer 150 includes a silicon oxide layer.

Figure 3:
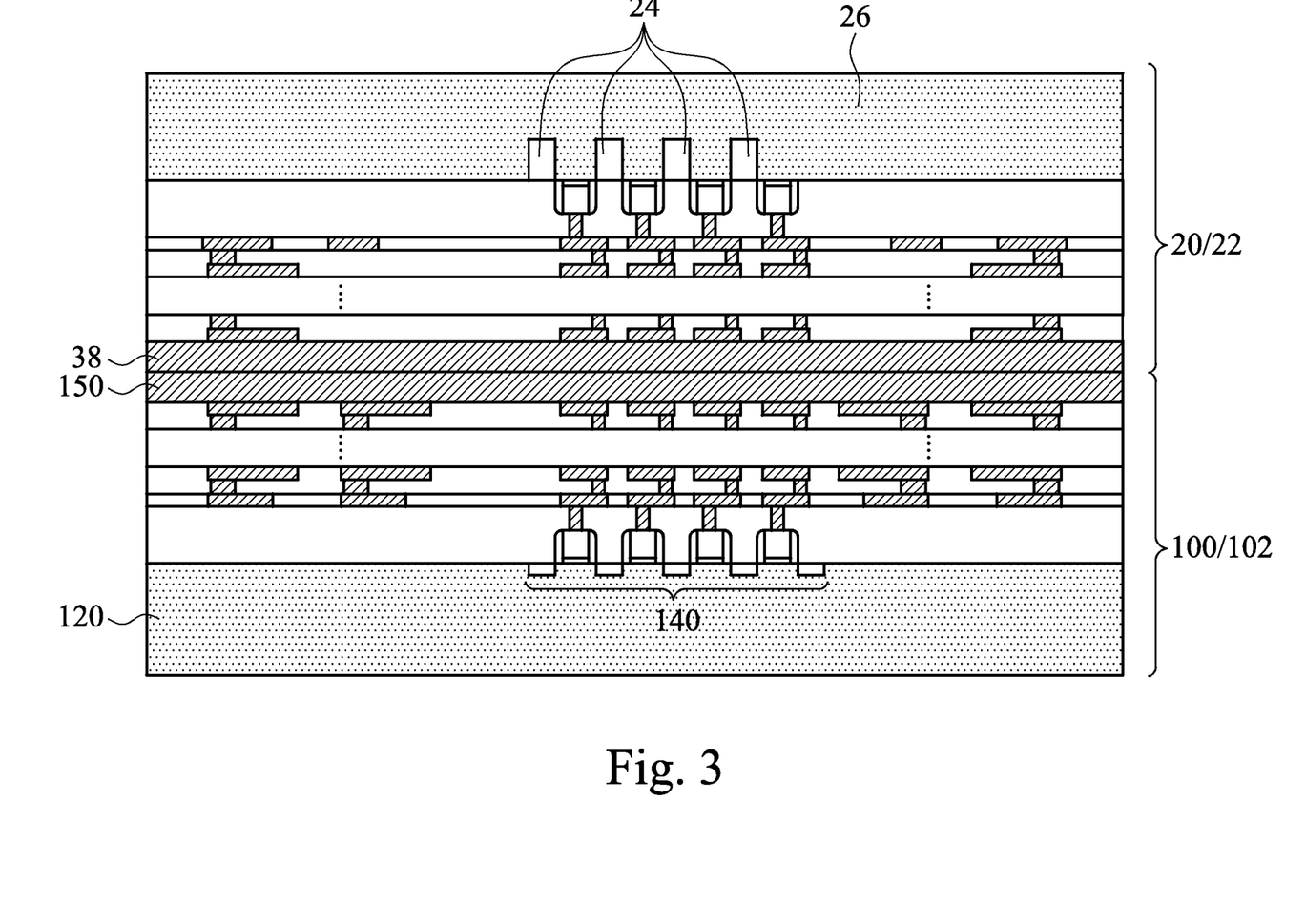
Figure 4:
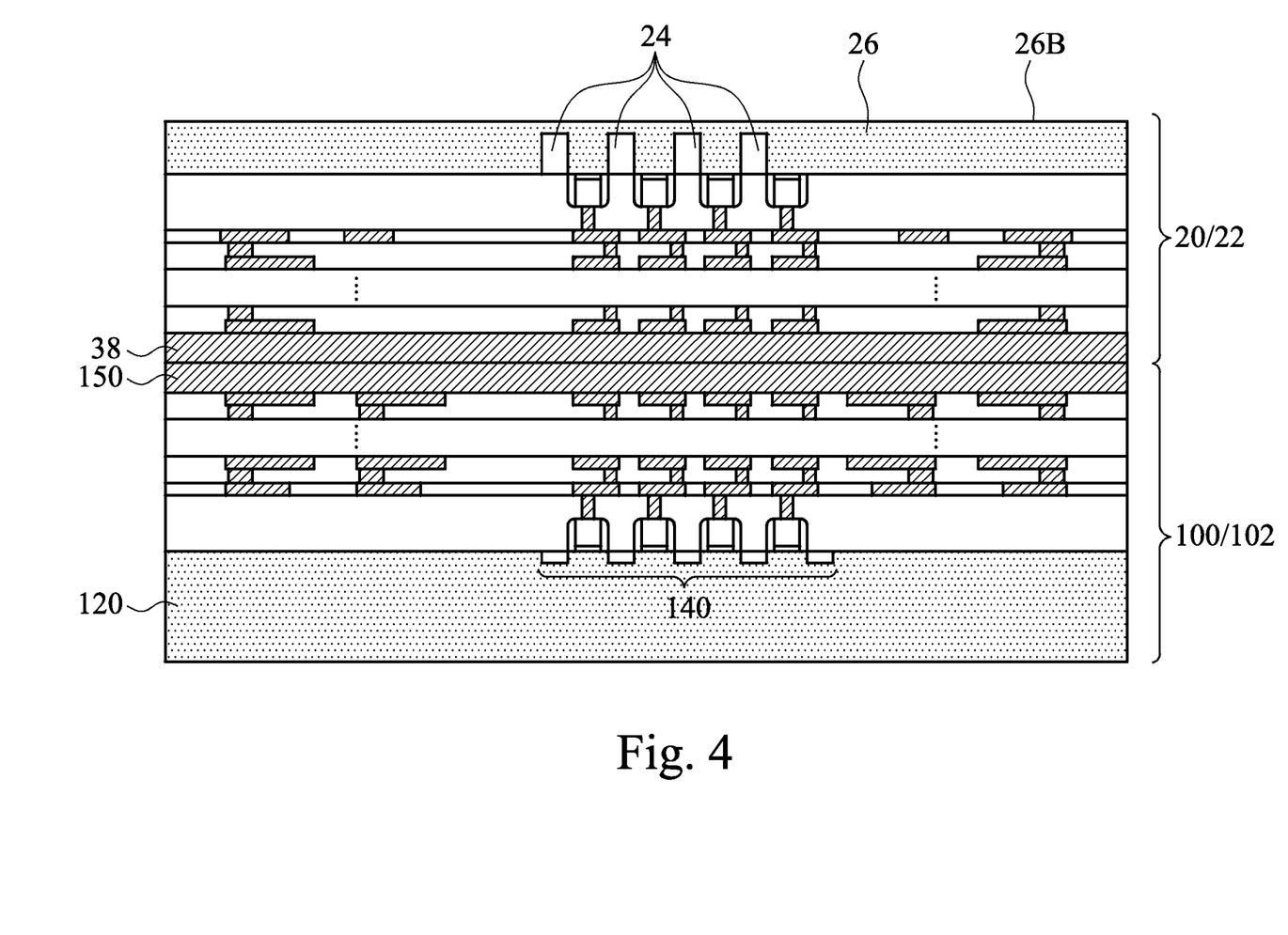

Referring to FIG. 3, wafers 22 and 102 are bonded to each other through the bonding of passivation layers 38 and 150. In some embodiments, passivation layers 38 and 150 are oxide layers, and the respective bonding is an oxide-to-oxide bonding. Next, as shown in FIG. 4, a backside grinding is performed to thin down semiconductor substrate 26, and the thickness of substrate 26 is reduced. With semiconductor substrate 26 having a small thickness, light can penetrate from back surface 26B into semiconductor substrate 26, and reach image sensors 24. In the backside grinding, wafer 102 acts as a carrier that provides mechanical support. Wafer 22 thus does not break even through wafer 22 has a very small thickness during and after thinning. Accordingly, during the backside grinding, no additional carrier is needed.

Figure 5:
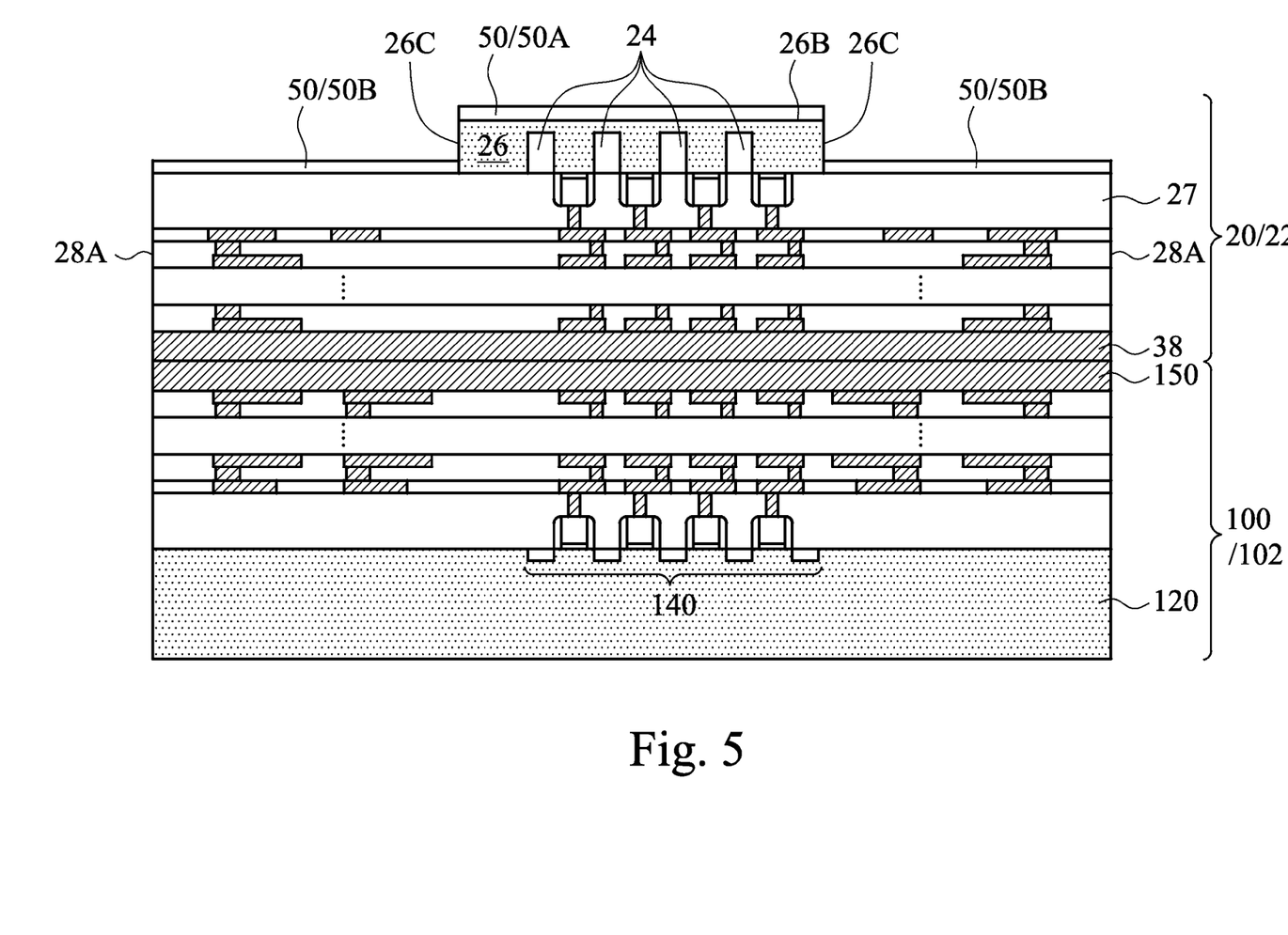

In FIG. 5, substrate 26 is etched. In some embodiments, the edge portions of substrate 26 are etched. A center portion of substrate 26, in which image sensors 24 and other circuits such as 72 and 74 (not shown in FIG. 5, please refer to FIG. 12) are formed, is not etched. As a result, interconnect structure 28 extends beyond the respective edges 26C of substrate 26. For example, the left edge 28A of interconnect structure 28 is further to the left than the left edge 26C of substrate 26, and/or the right edge 28A of interconnect structure 28 is further to the right than the right edge 26C of substrate 26.

After the removal of the portions of substrate 26, an underlying dielectric layer is exposed. In some embodiments, the exposed dielectric layer 27 is ILD 27, a Contact Etch Stop Layer (CESL), or the like. Next, upper layers 50 (sometimes referred to as buffer layers) are formed on the back surface of semiconductor substrate 26. Upper layers 50 are also formed on the exposed dielectric layer such as ILD 27. In some exemplary embodiments, upper layers 50 include one or more of Bottom Anti-Reflective Coating (BARC), silicon oxide layer, and silicon nitride layer. Upper layers 50 include portion 50A on the back surface 26B of substrate 26, and portions 50B on the dielectric layer (such as ILD 27).

Figure 6:
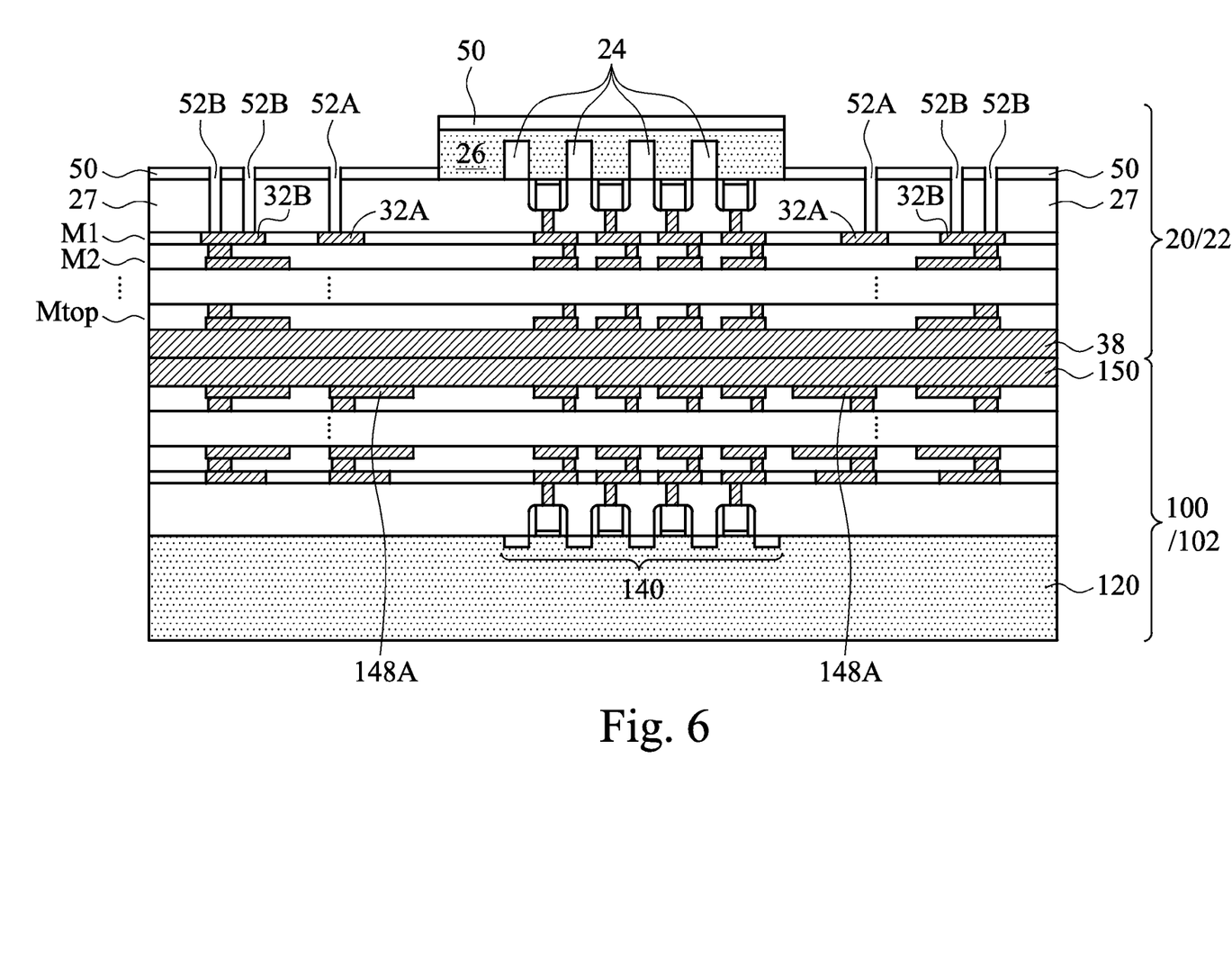

FIG. 6 illustrates the formation of via openings 52A and 52B, which penetrate through upper layers 50 and ILD 27. Via openings 52A and 52B are formed by etching upper layers 50 and ILD 27, for example, using an anisotropic etching method. Metal pads 32A and 32B are exposed through via openings 52A and 52B, respectively. In some embodiments, metal pads 32A and 32B are in the bottom metal layer M1 in wafer 22. In alternative embodiments, metal pads 32A and 32B are in another one of metal layers M2 through Mtop. During the etching for forming via openings 52A and 52B, metal pads 32A and 32B may act as the etch stop layer.

Figure 7:
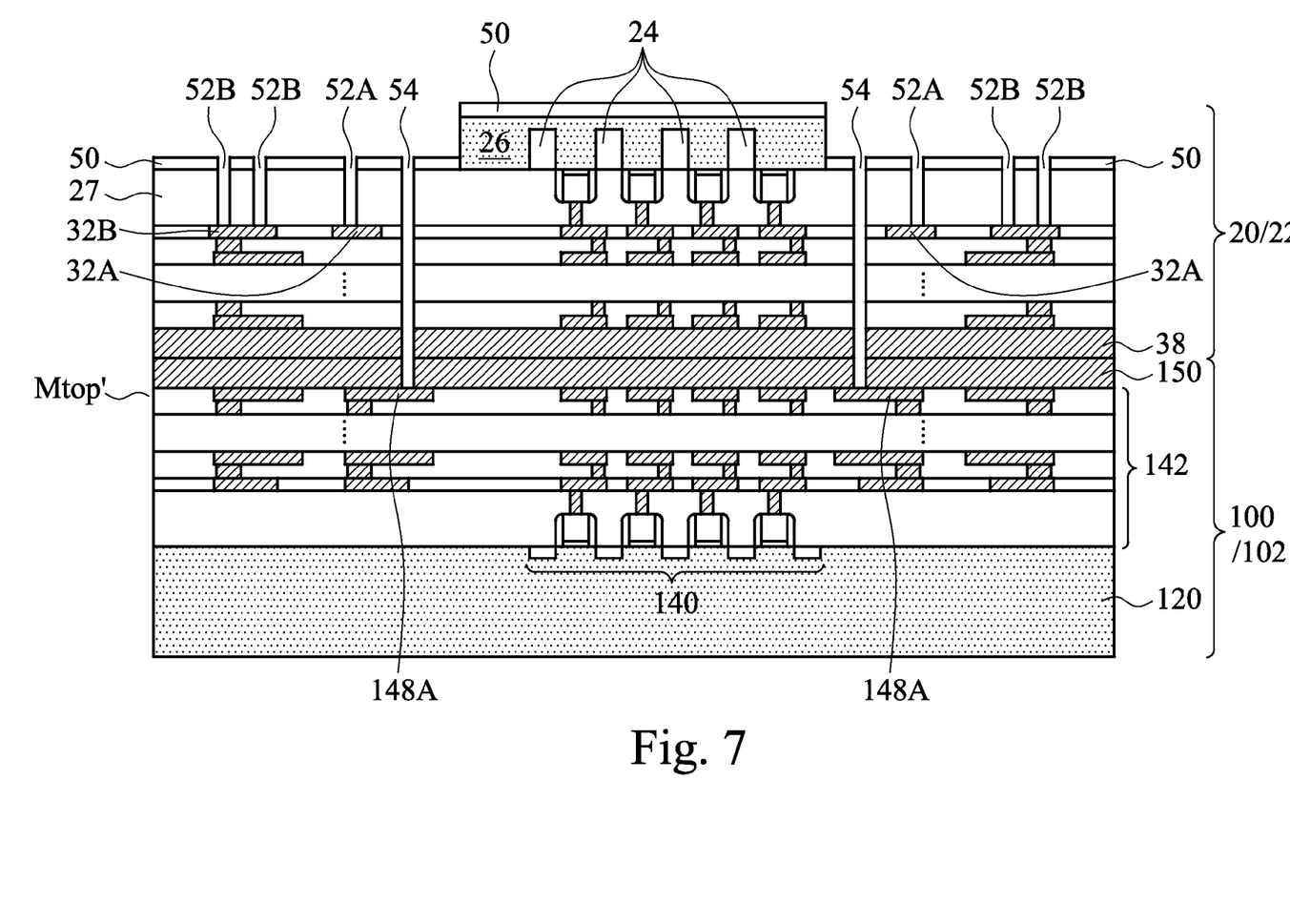

Referring to FIG. 7, via openings 54 are formed to penetrate through image sensor chip 20, including upper layers 50, ILD 27, and passivation layer 38. Via openings 54 further penetrate through passivation layer 150, so that metal pads 148A are exposed through via openings 54. In some embodiments, metal pads 148A are in the top metal layer Mtop' in wafer 102. In alternative embodiments, metal pads 148A are in another metal layer other than metal layer Mtop'. Metal pads 148A act as the etch stop layer in the etching step for forming via openings 54.

Figure 8:
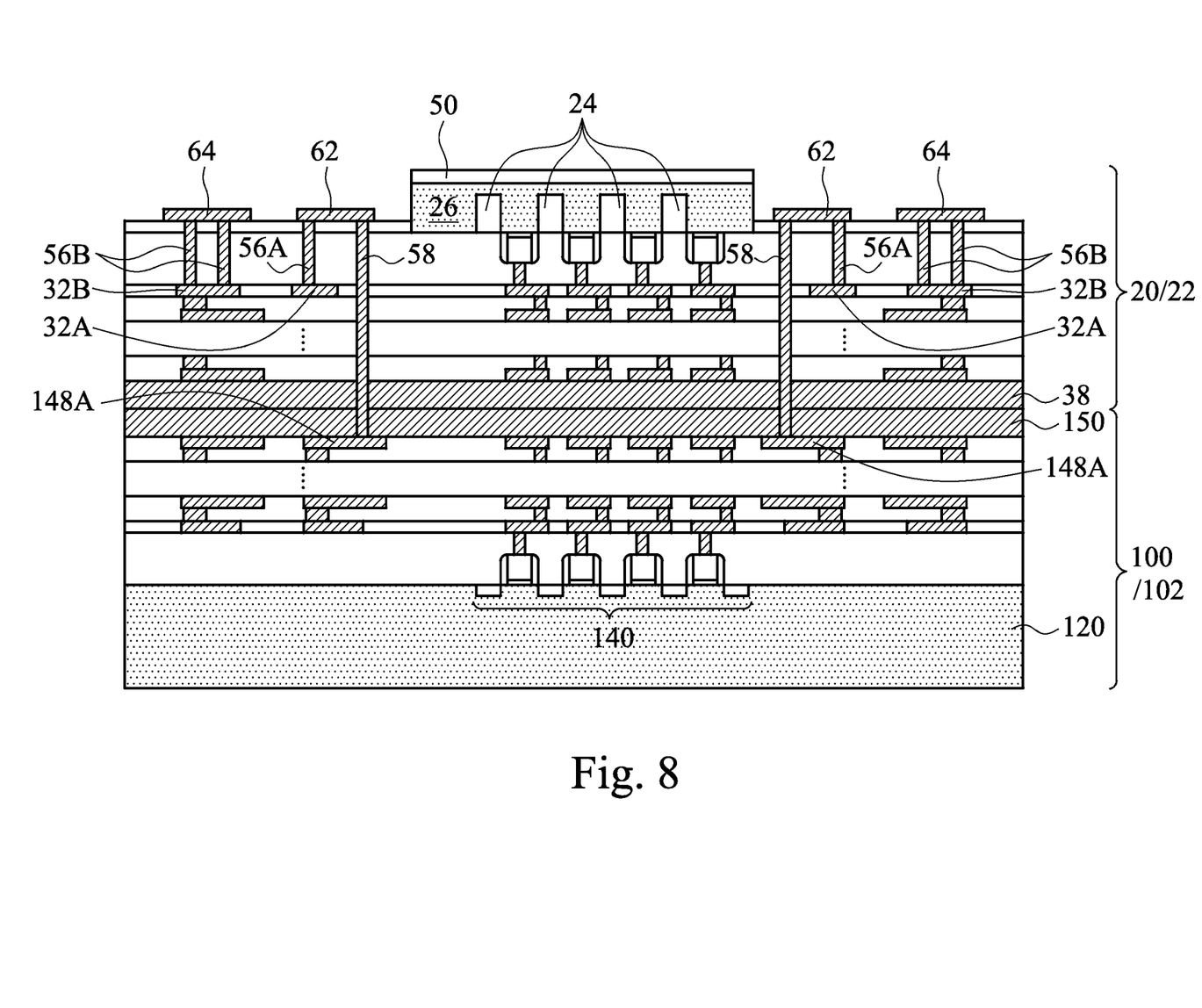

In FIG. 8, a conductive material, which may comprise aluminum, copper, aluminum copper, tungsten, nickel, gold, and/or the like, is filled into via openings 52A, 52B, and 54. Furthermore, the conductive material comprises portions on the top surfaces of upper layer 50. The conductive material may be formed by a blanket deposition method such as Physical Vapor Deposition (PVD). Next, a patterning is performed to remove the portions of the conductive material on upper layers 50. The remaining portions of the conductive material form vias 56A, 56B, and 58, and electrical connectors 62 and 64. Electrical connectors 62 are also referred as micro pads 62, which are used to electrically interconnect metal pads 32A and 148A, so that the circuit devices in wafer 22 and the circuit devices in wafer 102 are interconnected. Electrical connectors 64 may be bond pads, for example, wire bond pads used for forming wire bonding. Through electrical connectors 64, the respective chip 20 and chip 100 are electrically coupled to external circuit components (not shown). As shown in FIG. 8, electrical connectors 62 and 64 are formed at a same level as substrate 26.

Figure 10:
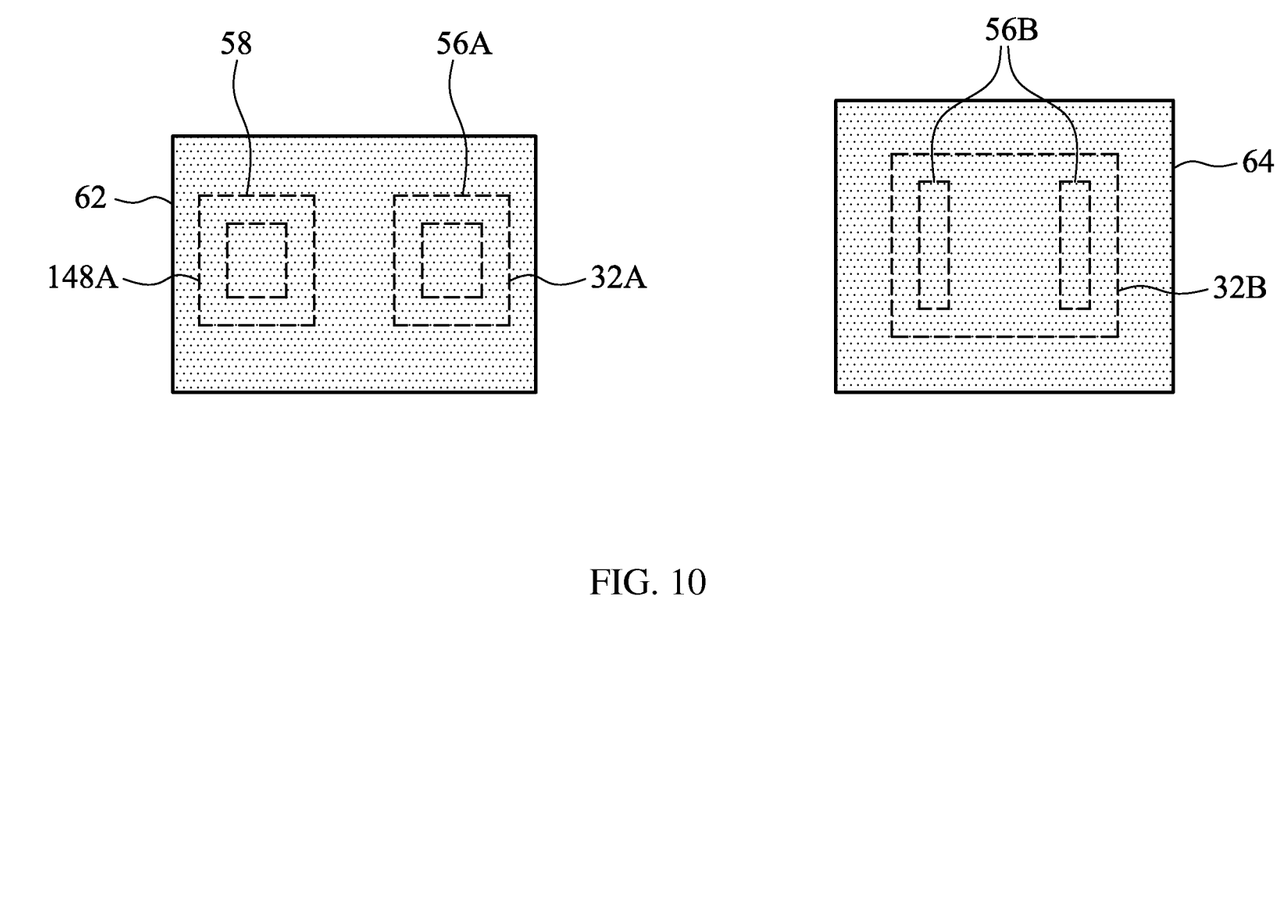
FIGS. 10 and 11 illustrate top views of the electrical connectors and the vias for interconnecting a BSI chip and a device chip.
Figure 11:
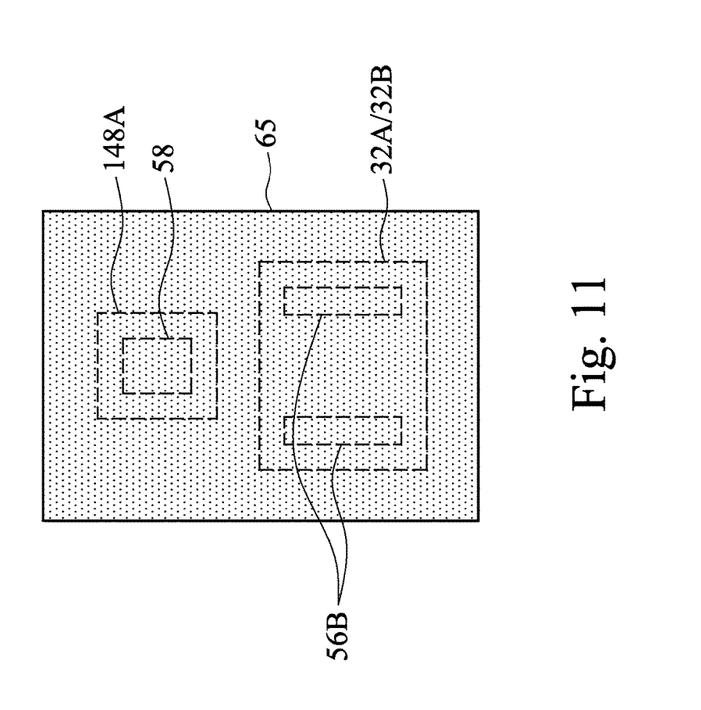

FIG. 10 illustrates a top view of a portion of the circuit in FIG. 8, wherein the top view illustrates vias 56A, 56B, and 58, metal pads 32A and 148A, and electrical connectors 62 and 64. Vias 56A, 56B, and 58, and metal pads 32A and 148A are illustrated as dashed since they are under the respective electrical connectors 62 and 64. In the embodiments shown in FIG. 10, electrical connectors 62 and 64 are separated from each other. In alternative embodiments, as shown in FIG. 11, electrical connectors 62 and 64 in FIG. 10 are merged to form electrical connector 65, which electrically interconnects metal pads 32A (or 32B) and 148A, and acts as the both the bond pad and the electrical connection of chip 20 and chip 100.

Figure 9:
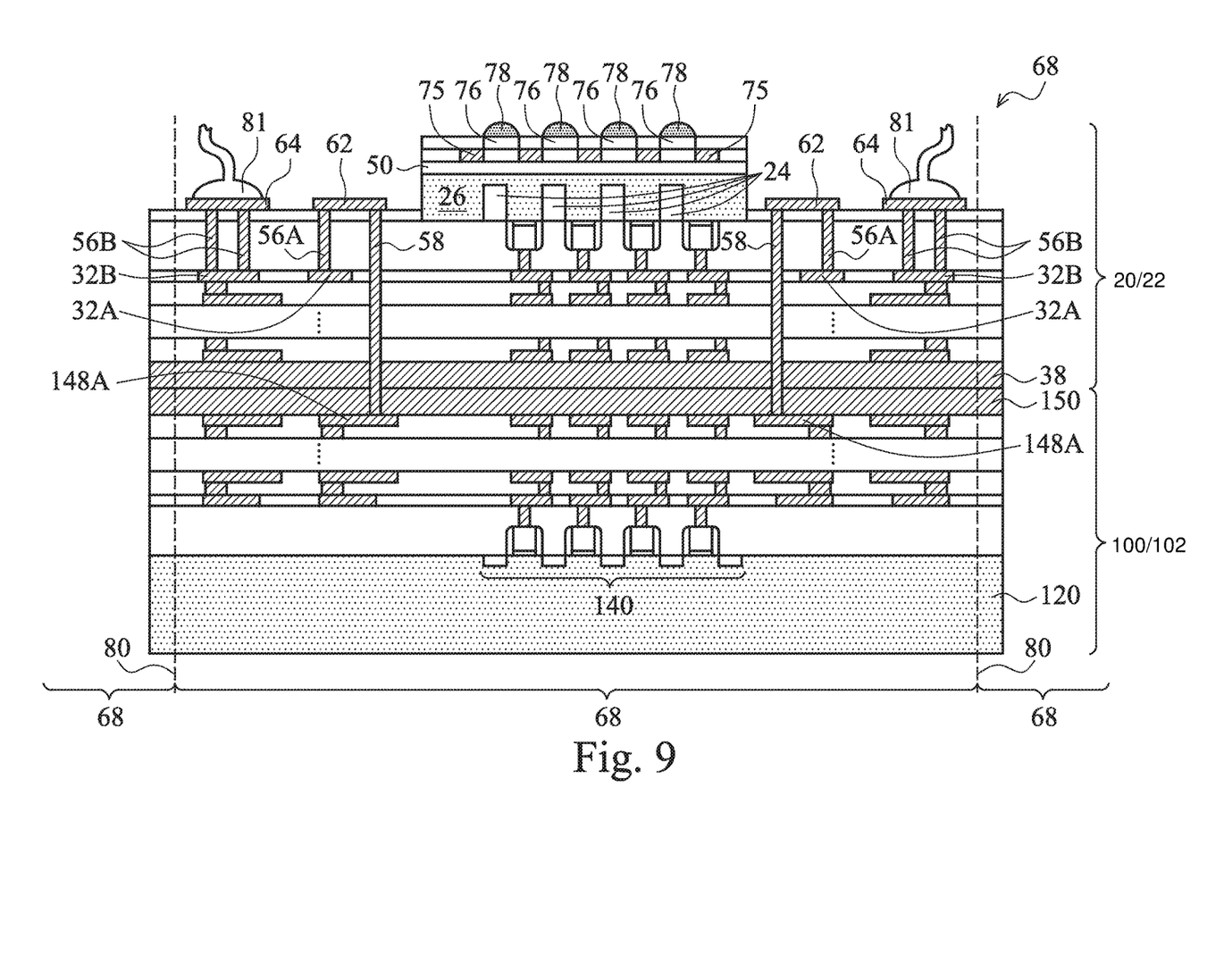

Referring to FIG. 9, in accordance with some exemplary embodiments, after the formation of electrical connectors 62 and 64, additional components such as metal grid 75, color filters 76, micro-lenses 78, and the like, are further formed on the top surface of upper layer 50. The resulting stacked wafers 22 and 102 are then sawed apart into dies 68, wherein each of dies 68 includes one chip 20 and one chip 100. The sawing is performed along scribe lines 80. In the embodiment die 68 is packaged using wire bonding, stud bumps 81 are formed on connectors 64.

Figure 13:
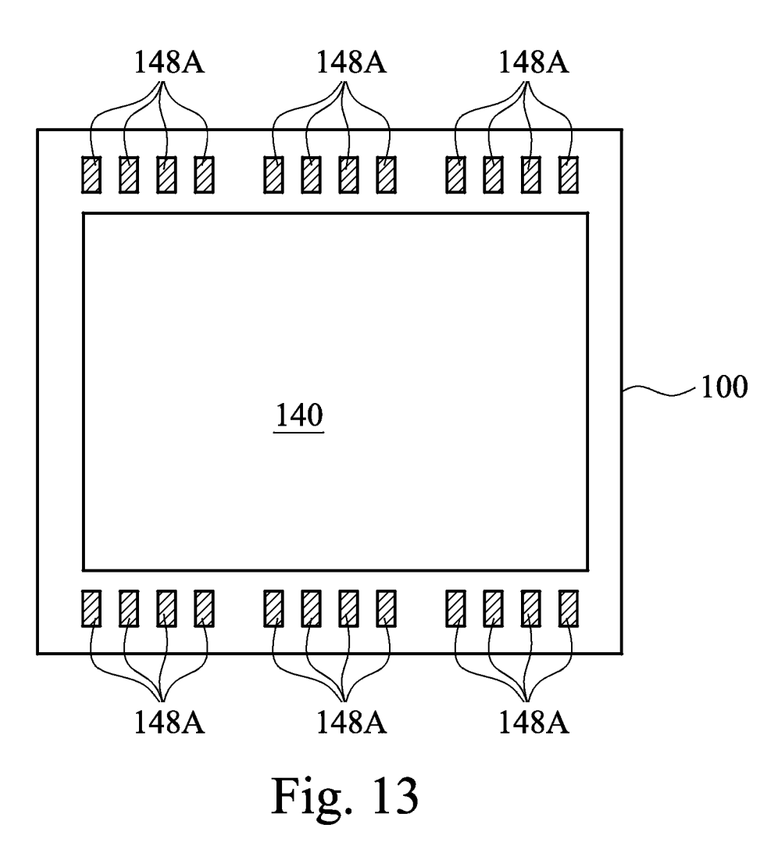

FIGS. 12 and 13 illustrate the schematic top views of the resulting chip 20 and chip 100 in each of dies 68. In some exemplary embodiments, as shown in FIG. 12, chip 20 includes image sensor array 25, ADC/DCS 72, row decoder 74, and the like. Electrical connectors 62 and 64 may be distributed along the peripheral region of chip 20. As shown in FIG. 13, in chip 100, metal pads 148A are also distributed to the peripheral region of chip 100, so that metal pads 148A may be used to connect to chip 20.

In the embodiments, the carrier wafer 102 (FIG. 9) has integrated circuits formed therein. Accordingly, some logic circuits that are otherwise formed in wafer 22 (and in BSI image sensor chip 20) may be formed in wafer 102 (and in device chip 100) instead. The size of BSI image sensor chip 20 is thus reduced. In addition, the logic circuits formed in chip 100 are no longer resided in the same chip as image sensors 24. Accordingly, the formation process for forming the logic circuits may be customized, so that the performance of the logic circuit may be optimized without the concern of sacrificing the performance of image sensor chip 20.

In accordance with embodiments, a device includes a BSI image sensor chip, which includes an image sensor disposed on a front side of a first semiconductor substrate, and a first interconnect structure including a plurality of metal layers on the front side of the first semiconductor substrate. A device chip is bonded to the image sensor chip. The device chip includes an active device on a front side of a second semiconductor substrate, and a second interconnect structure including a plurality of metal layers on the front side of the second semiconductor substrate. A first via penetrates through the BSI image sensor chip to connect to a first metal pad in the second interconnect structure. A second via penetrates through a dielectric layer in the first interconnect structure to connect to a second metal pad in the first interconnect structure, wherein the first via and the second via are electrically connected.

In accordance with other embodiments, a device includes a BSI image sensor chip, which includes a first semiconductor substrate, and an image sensor array disposed on a front side of the first semiconductor substrate. A device chip is bonded to the image sensor chip. The device chip includes a second semiconductor substrate, and an integrated circuit device on a front side of the second semiconductor substrate. A via penetrates through the BSI image sensor chip. A metal pad is level with a portion of the first semiconductor substrate, wherein the metal pad electrically connects devices in the BSI image sensor chip to devices in the device chip through the via.

In accordance with some embodiments of the present disclosure, a method includes bonding a BSI image sensor chip to a device chip, forming a first via in the BSI image sensor chip to connect to a first integrated circuit device in the BSI image sensor chip, forming a second via penetrating through the BSI image sensor chip to connect to a second integrated circuit device in the device chip, and forming a metal pad to connect the first via to the second via.

In accordance with alternative embodiments of the present disclosure, a method includes etching a first portion of a first semiconductor substrate of a first wafer, with a second portion of the first semiconductor substrate remaining after the etching. A first dielectric layer of the first wafer is bonded to a second dielectric layer of the second wafer. The method further includes forming a first via opening and a second via opening penetrating through a third dielectric layer in the first wafer to expose a first metal pad and a second metal pad, respectively, in the first wafer. A third via opening is formed penetrating through the first wafer to expose a third metal pad in the second wafer. The first, the second, and the third via openings are filled to form a first via, a second via, and a third via, respectively. A metal pad is formed to electrically couple the second via to the third via, with the metal pad being coplanar with a portion of the second portion of the semiconductor substrate. Color filters and micro lenses are formed over the second portion of the semiconductor substrate.

In accordance with alternative embodiments of the present disclosure, a method includes bonding a BSI image sensor chip to a device chip, and etching-through a semiconductor substrate of the BSI image sensor chip to form a recess. A dielectric layer of the BSI image sensor chip is exposed to the recess. The method further includes, from the recess, forming a first via opening extending into, and a second via opening penetrating through, the BSI image sensor chip, forming a first via in the first via opening to connect to a first integrated circuit device in the BSI image sensor chip, forming a second via in the second via opening to connect to a second integrated circuit device in the device chip, and forming a metal pad to connect the first via to the second via.

In accordance with yet other embodiments, a method includes bonding a BSI image sensor chip to a device chip, forming a first via in the BSI image sensor chip to connect to a first integrated circuit device in the BSI image sensor chip, forming a second via penetrating through the BSI image sensor chip to connect to a second integrated circuit device in the device chip, and forming a metal pad to connect the first via to the second via.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:
1. A method comprising:
  bonding a Backside Illumination (BSI) image sensor chip to a device chip;
  forming a first via in the BSI image sensor chip to contact a first metal pad in the BSI image sensor chip;
  forming a second via penetrating through the BSI image sensor chip to contact a second metal pad in the device chip; and
  forming a third metal pad to electrically connect the first via to the second via;
  forming a third via in the BSI image sensor chip to connect to an additional metal pad in the BSI image sensor chip, wherein the first via and the third via are formed simultaneously; and
  forming a wire bond pad to connect to the third via.
2. The method of claim 1 further comprising:
  performing an etching step to remove portions of a semiconductor substrate of the BSI image sensor chip, wherein the third metal pad is formed in a space left by the removed portions of the semiconductor substrate;
  from a space left by the removed portions of the semiconductor substrate of the BSI image sensor chip, forming a first via opening extending into the BSI image sensor chip to expose the first metal pad in a first interconnect structure of the BSI image sensor chip;

forming a second via opening penetrating through the first interconnect structure to expose the second metal pad in a second interconnect structure of the device chip; and filling the first via opening and the second via opening to form the first via and the second via, respectively.

3. The method of claim 1, wherein a first dielectric layer of the BSI image sensor chip is bonded to a second dielectric layer of the device chip by the bonding, and wherein the bonding is performed through an oxide-to-oxide bonding.

4. The method of claim 1 further comprising forming color filters and micro lenses aligned to image sensors in the BSI image sensor chip.

5. The method of claim 2 further comprising, after the bonding, thinning down the semiconductor substrate of the BSI image sensor chip, with the etching step performed on the thinned semiconductor substrate of the BSI image sensor chip.

6. The method of claim 3, wherein the second via penetrates through the first and the second dielectric layers.

7. A method comprising:
etching a first portion of a first semiconductor substrate of a first wafer, with a second portion of the first semiconductor substrate remaining after the etching, wherein a first dielectric layer of the first wafer is bonded to a second dielectric layer of a second wafer;
forming a dielectric layer in a vacancy left by the etched first portion of the first semiconductor substrate;
etching the dielectric layer and the first wafer to form a first via opening and a second via opening in the first wafer, wherein a first metal pad and a second metal pad in the first wafer are exposed to the first via opening and the second via opening, respectively;
etching the dielectric layer, the first wafer, and a portion of the second wafer to form a third via opening penetrating, wherein a third metal pad in the second wafer is exposed to the third via opening;
filling the first, the second, and the third via openings to form a first via, a second via, and a third via, respectively; and
forming a conductive feature to electrically couple the second via to the third via, with the first metal pad being coplanar with a portion of the second portion of the first semiconductor substrate.

8. The method of claim 7, wherein the first wafer is an image sensor wafer comprising image sensors.

9. The method of claim 7 further comprising:
forming an electrical connector simultaneously with the forming the first metal pad, wherein the electrical connector is connected to the first via, and the electrical connector is in the vacancy; and
performing a wire bonding on the electrical connector.

10. The method of claim 7, wherein the etching the first portion of the first semiconductor substrate is performed until the first portion is etched-through and an Inter-Layer Dielectric (ILD) in the first wafer is exposed.

11. The method of claim 7, wherein when the dielectric layer in the vacancy is formed, an additional dielectric layer is simultaneously formed overlapping the second portion of the first semiconductor substrate, and the method further comprises forming color filters and micro lenses overlapping the additional dielectric layer.

12. The method of claim 7 further comprising sawing the first wafer and the second wafer, with saw lines passing through a recess in the first wafer, wherein the recess is formed by the etching the first portion of the first semiconductor substrate.

13. The method of claim 7, wherein the second wafer comprises a second semiconductor substrate, and wherein the first metal pad, the second metal pad, and the third metal pad are between the first semiconductor substrate and the second semiconductor substrate.

14. The method of claim 8, wherein the first wafer comprises a circuit selected from the group consisting essentially of an Analog-to-Digital Converter (ADC), a Correlated Double Sampling circuit, a row decoder, and combinations thereof.

15. A method comprising:
bonding a Backside Illumination (BSI) image sensor chip to a device chip;
etching-through a semiconductor substrate of the BSI image sensor chip to form a recess;
from the recess, forming a first via opening extending into, and a second via opening penetrating through, the BSI image sensor chip;
forming a first via in the first via opening to electrically couple to a first integrated circuit device in the BSI image sensor chip, wherein the first via lands on a first metal pad in the BSI image sensor chip;
forming a second via in the second via opening to connect to a second integrated circuit device in the device chip, wherein the second via lands on a second metal pad in the device chip; and
forming a metal pad in the recess to connect the first via to the second via.

16. The method of claim 15 further comprising, after the bonding, thinning the semiconductor substrate of the BSI image sensor chip.

17. The method of claim 15 further comprising:
forming a third via in the BSI image sensor chip to connect to an additional metal pad in the BSI image sensor chip, wherein the first via and the third via are formed simultaneously; and
forming a wire bond pad to connect to the third via, wherein the wire bond pad is in the recess.

18. The method of claim 15 further comprising performing a wire bonding to form a stud bump on the metal pad, with a portion of the stud bump in the recess.

19. The method of claim 15 further comprising forming color filters and micro lenses aligned to image sensors in the BSI image sensor chip.

20. The method of claim 15, wherein the recess extends from a top surface to a bottom surface of the semiconductor substrate, and both the first via opening and the second via opening extend from a bottom of the recess down into dielectric layers in the BSI image sensor chip.

* * * * *